United States Patent
Majid et al.

(10) Patent No.: US 6,798,061 B2
(45) Date of Patent: Sep. 28, 2004

(54) MULTIPLE SEMICONDUCTOR CHIP (MULTI-CHIP) MODULE FOR USE IN POWER APPLICATIONS

(75) Inventors: Naveed Majid, Mohegan Lake, NY (US); Ton Mobers, Grave (NL); Satyen Mukherjee, Yorktown Heights, NY (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/440,595

(22) Filed: Nov. 15, 1999

(65) Prior Publication Data

US 2002/0079566 A1 Jun. 27, 2002

(51) Int. Cl.$^7$ .................... H01L 23/10; H01L 23/34
(52) U.S. Cl. .................... 257/707; 257/706; 257/709; 257/728; 257/500; 257/501; 257/723; 257/347; 257/712
(58) Field of Search .................... 257/707, 706, 257/709, 347, 723, 500, 501, 728, 712

(56) References Cited

U.S. PATENT DOCUMENTS

| | | | |
|---|---|---|---|
| 4,947,234 A | * | 8/1990 | Einzinger et al. ............. 357/68 |
| 5,828,564 A | | 10/1998 | Mori et al. ................. 363/141 |
| 5,998,868 A | * | 12/1999 | Pogge et al. ................. 257/730 |
| 6,028,348 A | * | 2/2000 | Hill ............................. 257/666 |
| 6,060,748 A | * | 5/2000 | Uchida et al. ............... 257/347 |
| 6,130,458 A | * | 10/2000 | Takagi et al. ................ 257/351 |
| 6,140,690 A | * | 10/2000 | Oka et al. .................... 257/494 |
| 6,150,724 A | * | 11/2000 | Wenzel et al. ............... 257/777 |
| 6,255,710 B1 | * | 7/2001 | Weitzel et al. .............. 257/501 |
| 6,300,649 B1 | * | 10/2001 | Hu et al. ...................... 257/69 |

FOREIGN PATENT DOCUMENTS

| | | |
|---|---|---|
| EP | 0219627 A1 | 4/1987 |
| EP | 0471938 A1 | 2/1992 |
| JP | 6169057 A | 6/1994 |
| JP | 07335811 | 12/1995 |

* cited by examiner

*Primary Examiner*—Steve Lohe
*Assistant Examiner*—Nitin Parekh
(74) *Attorney, Agent, or Firm*—Michael J. Ure

(57) ABSTRACT

A multiple semiconductor chip (multi-chip) module for use in power applications includes at least a power semiconductor chip and a control semiconductor chip mounted on an electrically conductive heat sink. The power semiconductor chip may be a Silicon-On-Insulator (SOI) device and the control semiconductor chip may be a semiconductor device having a substrate connected to ground potential. The power semiconductor chip and the control semiconductor chip are directly mounted on the electrically conductive heat sink without the use of a separate electrical insulation layer in order to obtain a multi-chip module which is simple and economical to manufacture, and which offers superior performance characteristics.

7 Claims, 1 Drawing Sheet

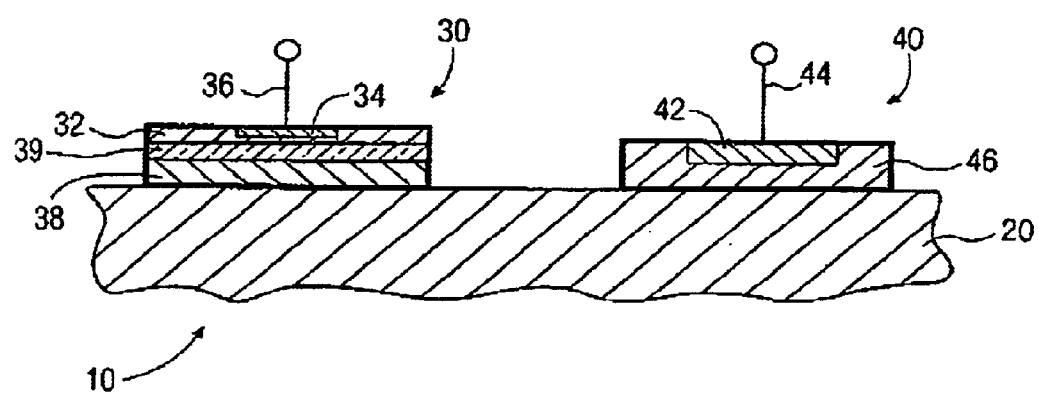

MULTIPLE SEMICONDUCTOR CHIP (MULTI-CHIP) MODULE FOR USE IN POWER APPLICATIONS

BACKGROUND OF THE INVENTION

The invention is in the field of semiconductor devices, and relates more specifically to multiple semiconductor chip (hereinafter multi-chip) modules for use in power applications.

Multi-chip module technology has recently been applied to integrated circuits used in high power applications, such as power supplies and electronic ballast circuits. Such multi-chip modules typically include at least a power semiconductor chip and a control semiconductor chip mounted on an electrically conductive (typically metal) heat sink. In the prior art, one or more of the chips employed in the module must be electrically insulated from the metal heat sink in order to maintain electrical isolation, thus requiring a relatively complicated structure which is costly to manufacture. Additionally, such a configuration is not ideal in terms of electrical performance, because electrically isolating one or more chips from the metal heat sink and having the heat sink float at other than ground potential may result in electromagnetic interference (EMI).

A typical prior-art device configuration is shown in Japanese patent abstract JP 6-169057A. In the elementary multi-chip module shown in this reference, one chip is shown as soldered directly to a heat sink, while a second chip is provided on an electrode plate, which is in turn provided on an insulating ceramic plate provided on the heat sink.

While the foregoing structure permits the fabrication of a multi-chip module incorporating different chip types and functions, it is relatively complicated and therefore uneconomical to manufacture, and in certain applications structures of this type will generate electromagnetic (EMI) radiation.

Accordingly, it would be desirable to have a multi-chip module for use in power applications which is simple in construction and therefore economical to fabricate, and in which performance parameters such as reduced EMI are enhanced.

SUMMARY OF THE INVENTION

It is therefore an object of the present invention to provide a multi-chip module for use in power applications which is simple in construction, economical to fabricate, and capable of offering enhanced performance.

In accordance with the invention, these objects are achieved in a multi-chip module of the type described above in which a plurality of semiconductor chips are all directly mounted on an electrically conductive heat sink without the use of a separate electrical insulation layer.

In a preferred embodiment of the invention, the multi-chip module includes at least a power semiconductor chip having a silicon-on-insulator (SOI) device and a control semiconductor chip having a semiconductor device with a substrate connected to ground potential, with both the power semiconductor chip and the control semiconductor chip being directly mounted on the electrically conductive heat sink without the use of a separate electrical insulation layer.

In further preferred embodiments of the invention, the control semiconductor chip includes BIMOS, bipolar, or CMOS devices and has a substrate connected to ground potential.

Multi-chip modules in accordance with the present invention offer a significant improvement in that a simple, economical configuration having improved performance characteristics is achieved.

These and other aspects of the invention will be apparent from and elucidated with reference to the embodiments described hereinafter.

BRIEF DESCRIPTION OF THE DRAWING

The invention may be more completely understood with reference to the following description, to be read in conjunction with the accompanying drawing, in which the single FIGURE shows a simplified cross-sectional view of a multi-chip module in accordance with a preferred embodiment of the invention.

It should be understood that the single FIGURE of the drawing is not drawn to scale.

DESCRIPTION OF THE PREFERRED EMBODIMENTS

In the simplified cross-sectional view of the single FIGURE, a multiple semiconductor chip (multi-chip) module 10 for use in power circuit applications is shown. The multi-chip module 10 includes an electrically conductive heat sink 20, typically a metal heat sink of copper or aluminum, on which are directly mounted a plurality of semiconductor chips, such as chips 30 and 40 shown in simplified form within bold rectangles in the FIGURE. It should be noted that the semiconductor chips 30 and 40 are directly mounted on the conductive heat sink 20 without the use of a separate electrical insulation layer as is typically required in the prior art.

In the example shown, semiconductor chip 30 is a power semiconductor chip, here shown as a Silicon-On-Insulator (SOI) device having a semiconductor substrate 38, a buried insulating layer 39, and an SOI layer 32 having at least one semiconductor device symbolically shown by region 34 provided therein. The term "power semiconductor chip" is to be understood as relating to any chip, such as a chip containing an output circuit, which operates at a higher power level than that of the control chip, and not to any specific power level. Electrical connections to the semiconductor device 34 are symbolically shown by the single electrode 36, although it will be apparent that in an actual device more than one connection will typically be provided. By placing all of the relatively high-voltage and high-power components of the multi-chip module on SOI power semiconductor chip 30, it becomes possible to directly mount the semiconductor chip on the conductive heat sink 20 without the use of a separate electrical insulation layer, since the portions of the chip connected to high voltage are insulated from the substrate 38 by oxide insulation layer 39 within the chip itself. Power semiconductor chip 30 can be directly mounted on the conductive heat sink 20 by known conventional methods, such as soldering or gluing with a conductive glue. If power semiconductor chips other than SOI chips are used, they must be capable of operating with their substrates connected directly to the conductive heat sink.

The multi-chip module 10 also includes a control semiconductor chip 40 shown in simplified form in the FIGURE, also directly mounted on the conductive heat sink 20 without the use of a separate electrical insulation layer. The control semiconductor chip 40 is symbolically shown by a substrate 46 in which is formed at least one semiconductor device 42, with electrical connections to the device being symbolically shown by the single connection electrode 44. As shown in the FIGURE, control semiconductor chip 40 employs bulk technology as opposed to SOI technology, with no insulating layer between device 42 and substrate 46.

In order to further reduce the manufacturing cost of multi-chip module 10, the control semiconductor chip 40 can employ a low-cost technology such as BIMOS, bipolar, or CMOS to implement the control circuit devices symbolically shown by reference numeral 42. It will be recognized that various technologies may be used to fabricate the control circuitry, the only limitation being that the back of the chip (substrate 46) must be capable of being directly mounted on the conductive heat sink 20, which will typically be at ground potential. A further advantage of having the conductive heat sink 20 and the substrate of the control semiconductor chip 40 at ground potential is that electromagnetic radiation (EMI) will be reduced, since the grounded heat sink cannot serve as an antenna to radiate interference signals. As in the case of power semiconductor chip 30, control semiconductor chip 40 may be mounted to the conductive heat sink 20 by soldering or other conventional electrically conductive fastening technique.

It will be understood that while the simplified representative structure shown in the single FIGURE depicts a preferred embodiment of the invention, numerous variations in device geometry, configuration and number of chips used are contemplated within the scope of the invention. Nevertheless, it is noted that several advantages accrue by using a configuration in accordance with the preferred embodiment. By directly mounting all of the semiconductor chips on the conductive heat sink without the use of a separate electrical insulation layer, the fabrication process is simplified and made more economical, EMI is reduced and efficient heat transfer is ensured. Additionally, by using a low-cost technology such as BIMOS, CMOS or bipolar for the control semiconductor chip(s), further advantages in economy and performance are obtained. Finally, by using an SOI device as the power semiconductor chip, direct mounting of this chip is facilitated while permitting great flexibility in high-voltage device design even though the substrate is typically grounded, since the active portion of the device is internally insulated from the substrate.

In the foregoing manner, the present invention provides a multi-chip module for use in power applications which is simple in structure, economical to fabricate and which offers performance advantages.

While the invention has been particularly shown and described with reference to several preferred embodiments thereof, it will be understood by those skilled in the art that various changes in form and detail may be made without departing from the spirit or scope of the invention. In this application it should be understood that the word "a" or "an" preceding an element does not exclude the presence of a plurality of such elements, and that the word "comprising" does not exclude the presence of other elements or steps than those described or claimed.

What is claimed is:

1. A multiple semiconductor chip (multi-chip) module, comprising at least a power semiconductor chip and a control semiconductor chip each mounted directly on an electrically conductive heat sink, wherein said power semiconductor chip comprises a Silicon-On-Insulator (SOI) device comprising a semiconductor substrate mounted directly on said electrically conductive heat sink, an insulating layer on said semiconductor substrate, an SOI layer on said buried insulating layer, and at least one semiconductor device provided in said SOI layer, wherein each semiconductor device in said SOI layer is electrically insulated from said electrically conductive heat sink by said insulating layer, and wherein said control semiconductor chip comprises a bulk technology semiconductor device having no insulating layer between a device layer and a substrate thereof, and having said substrate connected to ground potential and mounted directly on said electrically conductive heat sink, and said power semiconductor chip and said control semiconductor chip are directly mounted on said electrically conductive heat sink without the use of a separate electrical insulation layer.

2. A multi-chip module as in claim 1, wherein said control semiconductor chip semiconductor device comprises a BIMOS device.

3. A multi-chip module as in claim 1, wherein said control semiconductor chip semiconductor device comprises a CMOS device.

4. A multi-chip module as in claim 1, wherein said control semiconductor chip semiconductor device comprises a bipolar device.

5. A multi-chip module as in claim 1, wherein said conductive heat sink is connected to ground potential.

6. A multi-chip module as in claim 1, wherein said conductive heat sink comprises a metal.

7. A multi-chip module as in claim 6, wherein said metal comprises copper.

* * * * *